US009565753B2

(12) United States Patent
Hong et al.

(10) Patent No.: US 9,565,753 B2
(45) Date of Patent: Feb. 7, 2017

(54) FORMING METHOD OF STRETCHABLE SUBSTRATE, STRETCHABLE SUBSTRATE AND ELECTRONIC DEVICE HAVING STRETCHABLE SUBSTRATE

(71) Applicant: SNU R&DB FOUNDATION, Seoul (KR)

(72) Inventors: Yongtaek Hong, Seoul (KR); Jung hwan Byun, Seoul (KR); Sangwoo Kim, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/585,676

(22) Filed: Dec. 30, 2014

(65) Prior Publication Data

US 2015/0189741 A1    Jul. 2, 2015

(30) Foreign Application Priority Data

Dec. 30, 2013    (KR) .................. 10-2013-0166838

(51) Int. Cl.
*H05K 1/02* (2006.01)
*H05K 1/03* (2006.01)

(52) U.S. Cl.
CPC ............ *H05K 1/0283* (2013.01); *H05K 1/036* (2013.01); *Y10T 428/24802* (2015.01); *Y10T 428/24851* (2015.01)

(58) Field of Classification Search
CPC .................................................... H05K 1/0393
USPC .......................................................... 174/254
See application file for complete search history.

(56) References Cited

U.S. PATENT DOCUMENTS 6,674,158 B2 *    1/2004   Blalock ................. H01L 23/293
                                                                              257/678
2013/0333094 A1 * 12/2013   Rogers ................. A41D 19/015
                                                                              2/161.7

\* cited by examiner

*Primary Examiner* — Hoa C Nguyen
*Assistant Examiner* — Stanley Tso
(74) *Attorney, Agent, or Firm* — Paratus Law Group, PLLC

(57) ABSTRACT

There is provided a stretchable substrate including: a substrate having first Young's modulus and stretchability; and plurality of strain control patterns having second Young's modulus and arranged on the substrate, in which strain due to an external force depends on arrangement of the plurality of strain control patterns.

12 Claims, 9 Drawing Sheets

200

(a)

200

(b)

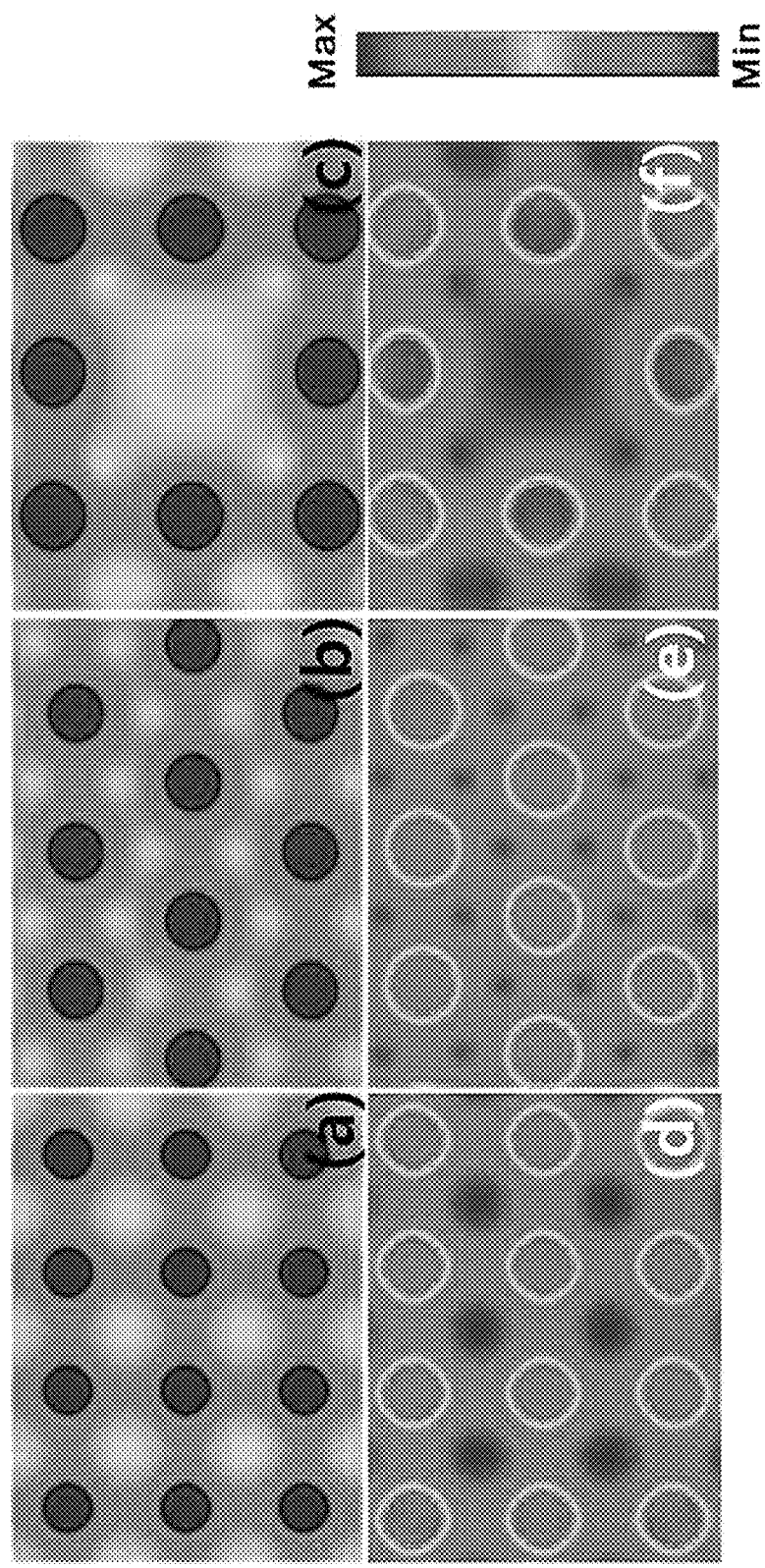

FORMING METHOD OF STRETCHABLE SUBSTRATE, STRETCHABLE SUBSTRATE AND ELECTRONIC DEVICE HAVING STRETCHABLE SUBSTRATE

CROSS-REFERENCE TO RELATED APPLICATIONS

This application claims the priority of Korean Patent Application No. 10-2013-0166838 filed on Dec. 30, 2013, in the Korean Intellectual Property Office, the disclosure of which is incorporated herein by reference.

BACKGROUND OF THE INVENTION

Field of the Invention

The present invention relates to a method of forming a stretchable substrate, a stretchable substrate, and an electronic device having a stretchable substrate.

Description of the Related Art

Recently, stretchable electronic devices have been highlighted. Those electronic devices can freely bend and curve in comparison to existing electronic devices, so an interest in the electronic devices have been increased in the fields of display and bio engineering. In the related art, since the stretchable electronic devices are formed on stretchable substrates, they are extended or compressed with extension and compression of the substrates. This is because when a physical force such as tensile, buckling or torsion force is applied to a general elastic body from the outside, the elastic body uniformly and isotropically deforms throughout the entire section.

When an external force is applied to a stretchable substrate, the stretchable substrate extends in the direction of the external force. In general, electronic circuits or wirings formed on substrates have different Young's modulus from that of the substrates, so the degree of strain of the electronic circuits or wirings due to an external force is different from that of the substrates. For example, when an electrical wiring having low stretchability is formed on a substrate having higher stretchability than the wirings, and then a tensile force is applied to the substrate, the electrical wiring that is lower in stretchability than the substrate cannot extend as much as the substrate and stress is exerted in the electrical wiring, so the electric wiring is physically damaged, such as cracking. Accordingly, an electronic or an electric device electrically connected through the electrical wiring cannot stably operate. This phenomenon may occur even when not only the electrical wiring, but another electronic device having stretchability different from that of the stretchable substrate is formed on the substrate and then an external force is applied to the substrate, so it is difficult to guarantee stable operation of the electronic devices on the stretchable substrate.

SUMMARY OF THE INVENTION

An aspect of the present invention provides a method of forming a stretchable substrate that can reduce physical stress in an element or a wiring, even if an external force is applied. Another aspect of the present invention provides an electronic device that stably operates even under an external force, because an element or a wiring thereon is less physically damaged, even if an external force is applied.

According to an aspect of the present invention, there is provided a stretchable substrate including: a substrate having first Young's modulus and stretchability; and strain control patterns having second Young's modulus and arranged on the substrate, in which strain due to an external force depends on arrangement of the strain control patterns.

According to another aspect of the present invention, there is provided a method of forming a stretchable substrate that includes: forming strain control patterns on a stretchable support substrate; and covering the strain control patterns on the stretchable support substrate with a stretchable member.

According to another aspect of the present invention, there is provided an electronic device including: a stretchable substrate; and an electronic circuit unit on the stretchable substrate, in which strain control patterns are disposed inside the stretchable substrate.

BRIEF DESCRIPTION OF THE DRAWINGS

The above and other aspects, features and other advantages of the present invention will be more clearly understood from the following detailed description taken in conjunction with the accompanying drawings, in which:

FIG. 9 is a view illustrating the result of testing on stress distribution when a tensile force is applied to a stretchable substrate according to the embodiment.

DETAILED DESCRIPTION OF THE PREFERRED EMBODIMENT

Figure 1:
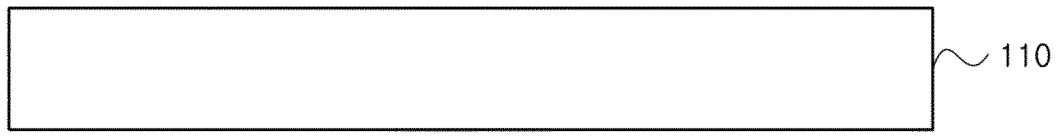
FIGS. 1 to 4 are cross-sectional views of a stretchable substrate in processes according to an embodiment of the present invention.

The description of the present invention is just examples for structural and functional illustration, and thus the scope of the present invention should not be construed as being limited by these examples. That is, since the present invention may be variously modified and have several exemplary embodiments, the scope of the present invention should be understood as including equivalents by which the spirit of the present invention can be achieved.

The terms used herein should be understood as follows.

Terms, such as "first" and "second", are for discriminating one component from another component, but the scope is not limited to the terms. For example, the first component may be named the second component and the second component may also be similarly named the first component.

It is to be understood that when one element is referred to as being "on" or "above" another element, it may be directly on another element, but other elements may be disposed between them. On the other hand, it is to be understood that when one element is referred to as being "in contact with" another element, it may be connected to another element without other elements therebetween. Further, other expressions describing the relationships of components, that is, "interposed" and "directly interposed, "between" and "directly between", or "close to" and "directly close to" should be understood in the same way.

Singular forms are intended to include plural forms unless the context clearly indicates otherwise. It will be further understood that the terms "comprises" or "have" as used in this specification specify the presence of stated features, steps, operations, components, parts, or a combination thereof, but do not preclude the presence or addition of one or more other features, numerals, steps, operations, components, parts, or a combination thereof.

The steps happen in different ways from the order described herein unless the context clearly indicates the order otherwise. That is, the steps may be generated in the order described and substantially simultaneously, but they may be performed in reverse direction.

In the drawings referred to herein for describing exemplary embodiments of the present invention, the size, height, thickness, and the like, may be intentionally exaggerated and not absolutely enlarged or reduced in accordance with scales. Further, some components may be intentionally reduced and some other components may be intentionally enlarged.

Unless defined otherwise, it is to be understood that all the terms used herein including technical and scientific terms have the same meaning as those as understood by those who are skilled in the art. It should be understood that the terms defined by dictionaries must be identical with the meanings within the context of the related art, and they should not be ideally or excessively formally defined unless the context clearly dictate otherwise.

Figure 2:
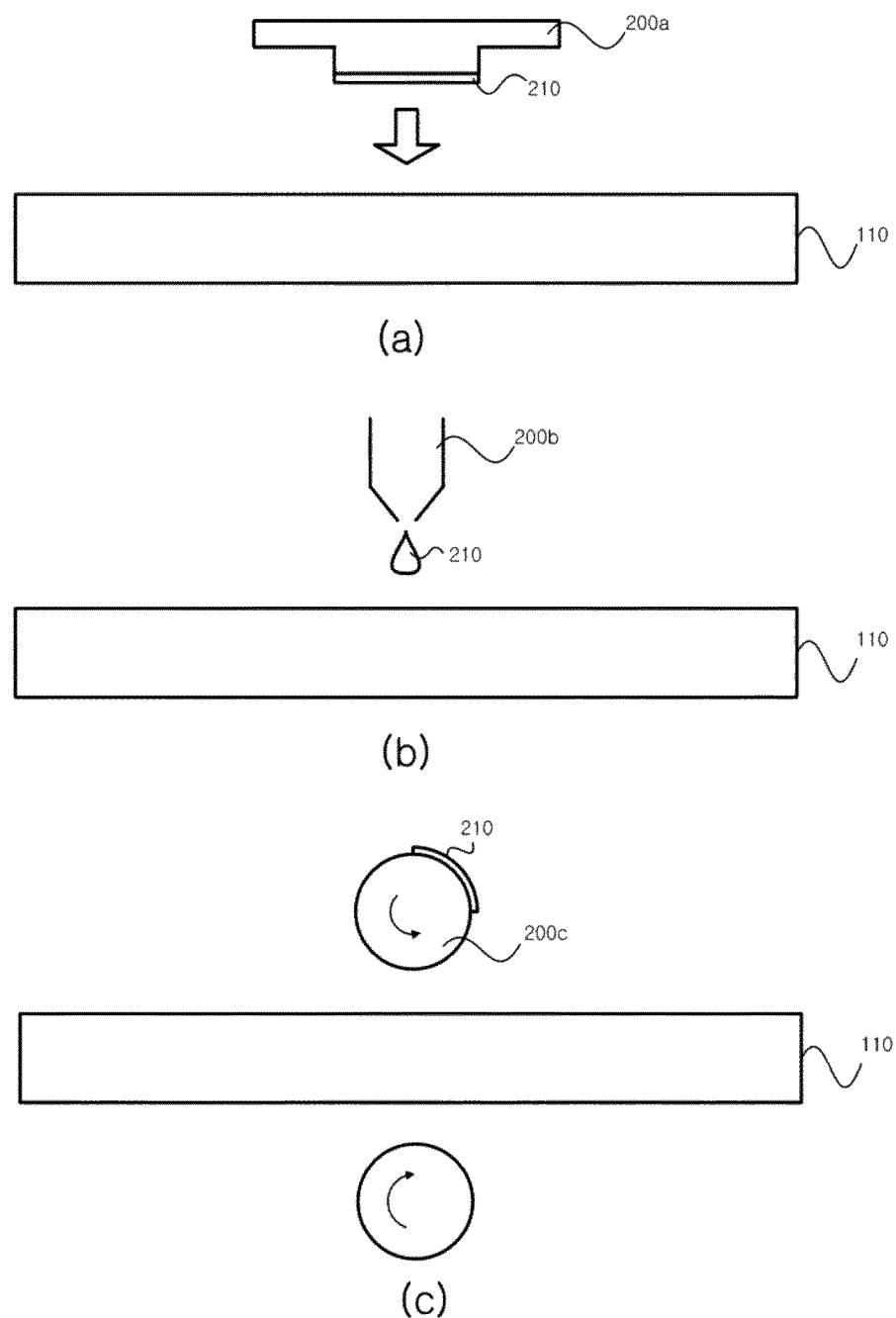
Figure 3:
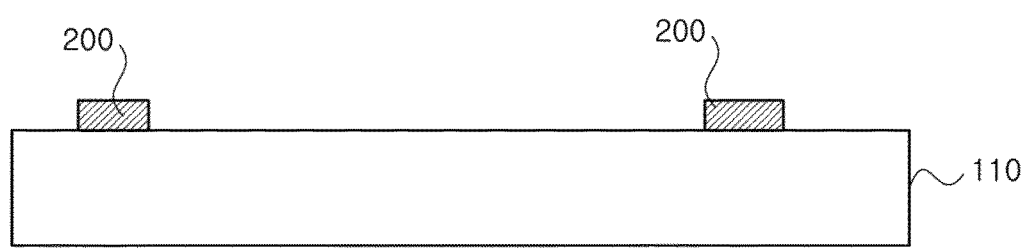
Figure 4:
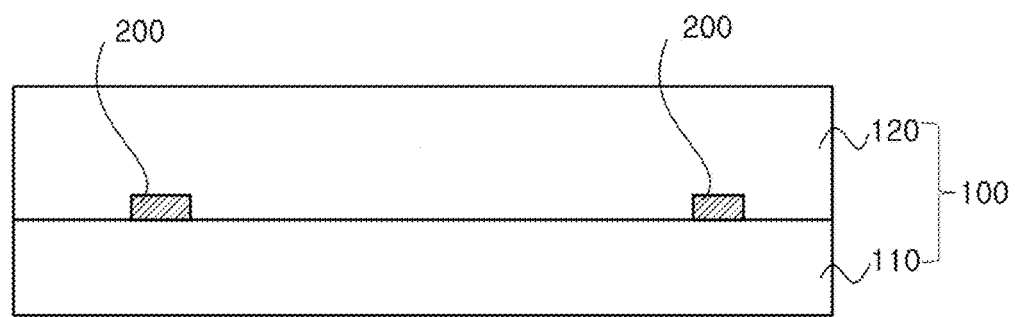
Figure 5:
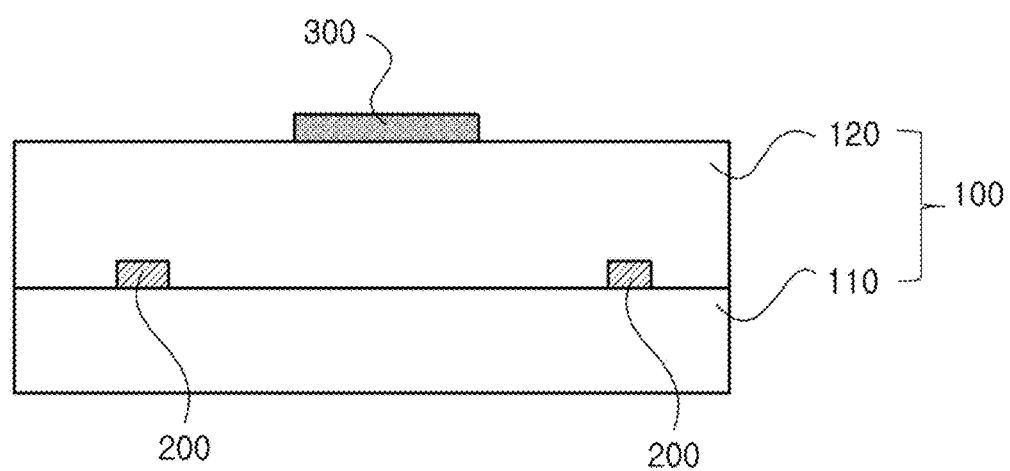
FIG. 5 is a cross-sectional view schematically illustrating an electronic device according to an embodiment of the present invention.

A method of forming a stretchable substrate according to an embodiment of the present invention and a stretchable substrate will be described with reference to the accompanying drawings. FIGS. 1 to 4 are cross-sectional views of a stretchable substrate in processes according to an embodiment of the present invention and FIG. 5 is a cross-sectional view schematically illustrating an electronic device according to an embodiment of the present invention. Referring to FIGS. 1 and 2, a strain control pattern is formed on a stretchable support substrate 110. In an embodiment, the stretchable support substrate 110 is made of a stretchable material. The stretchable support substrate may be made of, for example, any one of PDMS (Polydimethylsiloxane), epoxy resin, polyurethane, and ecoflex. However, those are just examples of materials that the stretchable support substrate can be made of, and the stretchable support substrate may be made of other stretchable materials.

The strain control pattern is formed on the stretchable support substrate 110. In an embodiment, the strain control pattern may be formed by putting a polymer material 210 such as ETPTA (ethoxylated trimethylolpropane trizcrylate), PMMA (poly methyl methacrylate), polystyrene, ecoflex, and hydrogel onto the stretchable support substrate 110, and then curing the polymer material. For example, the polymer material may be printed on the stretchable support substrate. In order to print the polymer material 210, transfer printing that puts a polymer material to be formed onto a mold 200a and then printing it onto a stretchable support substrate, as illustrated in FIG. 2A, ink-jet printing that printing the polymer material 210 by injecting it through a nozzle 200b, as illustrated in FIG. 2B, or gravure printing and roll-to-roll printing that prints the polymer material 210 onto a stretchable support substrate, using rollers 200c, as illustrated in FIG. 2C may be used.

As another embodiment, the strain control pattern may be formed by photo lithography. For example, the strain control pattern is formed by forming a polymer material layer on a stretchable support substrate, forming a mask pattern, and then etching them. Alternatively, the strain control pattern may be formed by forming a mask pattern on a stretchable support substrate, forming and curing a polymer material layer and then removing the cured polymer on the mask pattern except the strain control pattern formed on the stretchable support substrate.

The strain control pattern 200 is formed by curing the polymer material 210 on the stretchable support substrate. Referring to FIG. 3, when the polymer material 210 is a photo-curable polymer that is cured by light such as visible light or ultraviolet rays, the strain control pattern 200 is formed by curing the polymer material 210 by radiating visible light or ultraviolet rays to it. As another embodiment, when a thermal-curable polymer material that is cured by heat is used, the strain control pattern 200 is formed by curing the polymer material by heating it. As another embodiment (not illustrated), a strain control pattern that is formed in advance maybe mounted on the stretchable support substrate 110.

The Young's modulus of the strain control pattern 200 is different from that of the stretchable support substrate. The Young's modulus of a strain control pattern has only to be different from that of a stretchable support substrate, but is not necessarily be larger or smaller than that of a stretchable support substrate.

A plurality of strain control patterns 200 on the stretchable support substrate is covered with a stretchable member 120. Referring to FIG. 4, in an embodiment, the stretchable member 120 is the same material as that of the stretchable support substrate 110. That is, when the stretchable support substrate 110 is cured PDMS, a stretchable substrate 100 is formed by applying non-cured PDMS and then curing it with light or heat. When the stretchable support substrate 110 is made of epoxy resin or polyurethane, the stretchable member 120 is also made of epoxy resin or polyurethane. Since the stretchable support substrate 110 and the stretchable member 120 are made of the same material, when an external force such as a tensile force is applied to the stretchable substrate, the same amount of force is applied, so delamination of the stretchable support substrate 110 and the stretchable member 120 is prevented.

In another embodiment, when the stretchable substrate 100 repeatedly bends in any one direction, any one of the stretchable support substrate 110 and the stretchable member 120 extends further than the other one. Accordingly, delamination may be easier by using the same material for the stretchable support substrate 110 and the stretchable member 120. In this case, any one of the stretchable support substrate 110 and the stretchable member 120 may be made of a material having less Young's modulus and larger elasticity.

An electronic circuit unit 300 is formed on the stretchable substrate 100. The electronic circuit unit 300 includes active elements such as a transistor and an integrated circuit, passive elements such as a resistor and a capacitor, and various sensors and/or conductive wirings, and performs predetermined functions. Referring to FIG. 5, the strain control pattern 200 may have Young's modulus larger than that of the stretchable substrate 100 and be more rigid than the stretchable substrate 100, or when the strain control pattern 200 may have Young's modulus smaller than that of the stretchable substrate 100 and be softer than the stretchable substrate 100, and in both cases, the electronic circuit unit 300 may be disposed over between the strain control patterns 200.

Figure 6:
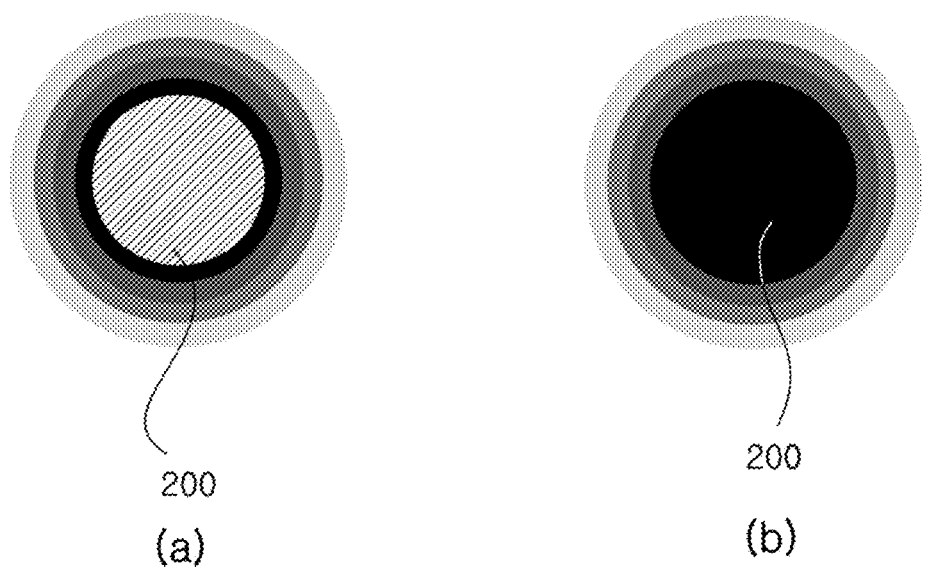
FIG. 6 is a view schematically illustrating stress distribution when an external force is applied to a stretchable substrate according to an embodiment of the present invention.

FIG. 6 is a view schematically illustrating stress distribution when an external force is applied to a stretchable substrate according to an embodiment of the present invention, in which the portion with the largest change in strain is indicated by black, and as the color become light, the change in strain decreases. According to the embodiment, when a strain control pattern having Young's modulus larger than those of the stretchable support substrate 110 and the stretchable member 120 is disposed inside a stretchable substrate and an external force (tensile strain) is applied to the stretchable substrate, it can be seen, as illustrated in FIG. 6A, that stress on the surface of the stretchable substrate concentrates on periphery of the strain control pattern 200 and decreases as the distance from the strain control pattern increases.

According to another embodiment of the present invention, when a strain control pattern having Young's modulus smaller than those of the stretchable support substrate 110 and the stretchable member 120 is disposed inside a stretchable substrate and an external force (tensile strain) is applied to the stretchable substrate, it can be seen, as illustrated in FIG. 6B, that stress on the surface of the stretchable substrate concentrates on the strain control pattern 200 and decreases as the distance from the strain control pattern increases.

Figure 7:
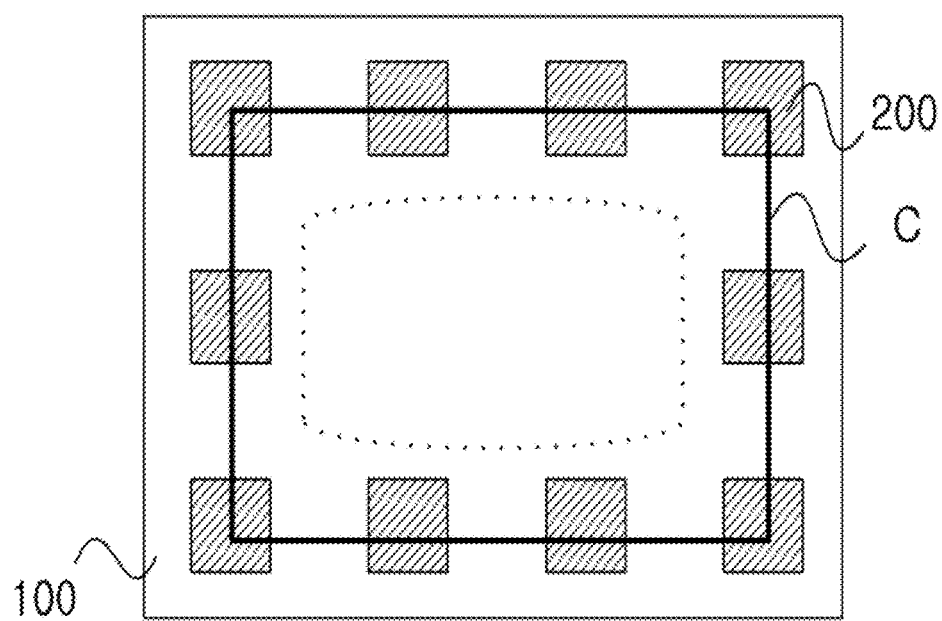
FIGS. 7 and 8 are views schematically illustrating a portion of a perspective plan view of a stretchable substrate according to an embodiment of the present invention.

When an external force is applied to a stretchable substrate with a strain control pattern therein, strain (stress) due to the external force concentrates on the strain control pattern or periphery of the strain control pattern, and it decreases as distance from the strain control pattern increases, such that the strain due to an tensile force applied to the stretchable substrate can be adjusted to be anisotropic in accordance with the arrangement of strain control patterns. For example, as illustrated in FIG. 7, when an external force is applied to a stretchable substrate 100 with a plurality of strain control patterns 200 arranged along a closed curve C, stress concentrates on strain control patterns 200 or periphery of the strain control patterns 200 and the inside of the closed curve C indicated by a dotted line is less affected by the stress. That is, when the plurality of strain control patterns 200 are arranged along a closed curve, stress due to an external force inside the closed curve is less, so an electronic circuit, and the like, stably operates by disposing an electronic circuit unit inside the closed curve.

Figure 8:
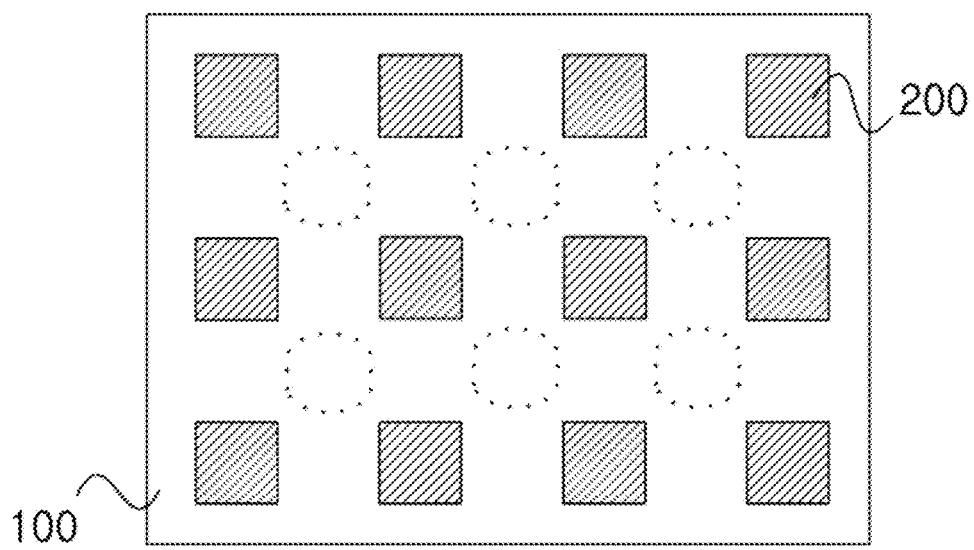
Figure 8:
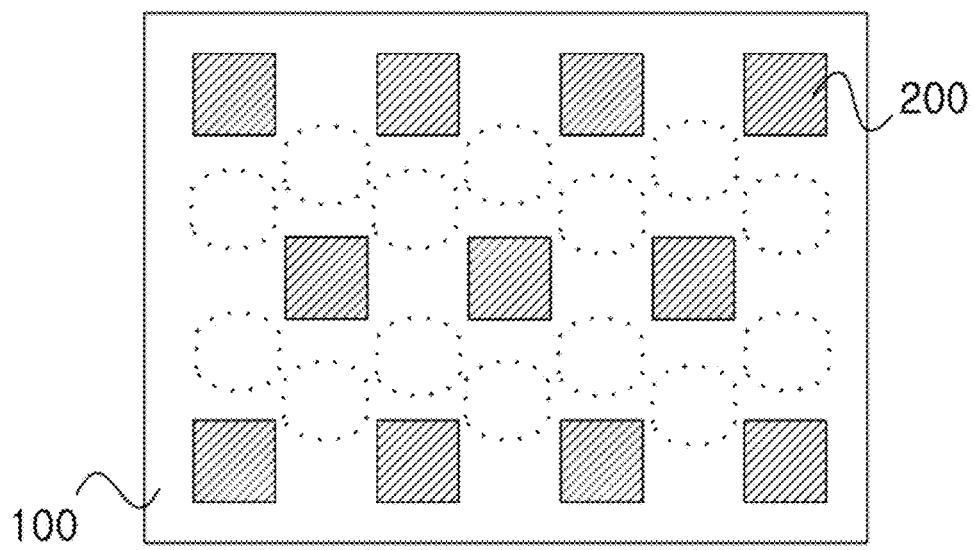

As another example, strain control patterns may be arranged in a lattice shape, as illustrated in FIGS. 8A and 8B. When strain control patterns are arranged in the shape of a lattice, stress due to an external force is decreased by adjacent strain control patterns, and accordingly, when elements such as an electronic circuit unit are disposed in the areas indicated by dotted lines among the strain control patterns, stress that is applied to the electronic circuit unit decreases, so it can stably operate.

Simulation Results

The simulation results of an embodiment of the present invention are described hereafter with reference to the accompanying drawings. In simulation on an embodiment of the present invention to be described hereafter, stretchable support substrate and stretchable member were made of PDMS and strain control patterns were made of ETPTA. FIGS. 9A to 9C depict the simulation results of the embodiment, where the Young's modulus of the strain control patterns and stretchable substrate are 650 MPa and 2 MPa respectively.

Further, in simulation on another embodiment of the present invention, stretchable support substrate and stretchable member were made of PDMS and strain control patterns were made of hydrogel. FIGS. 9d to 9f depict the simulation results of the embodiment, the Young's modulus of the strain control patterns and the stretchable substrates are 1 kPa and 2 MPa respectively.

In the simulation of the embodiments of the present invention, the strain control patterns were arranged in the shape of a lattice, as illustrated in FIGS. 9A, 9B, 9D, and 9E, and arranged along closed curves, as illustrated in FIGS. 9C and 9F, and external forces were applied to the stretchable substrates.

Referring to FIGS. 9A to 9C, the distribution of stress due to an external force when a tensile force is applied to the stretchable substrate according to an embodiment of the present invention, it can be seen that the strain control patterns illustrate the smallest strain (Min) due to the high Young's modulus. However, it is shown that the peripheral area of strain control patterns receive the largest stress and illustrate the largest strain.

In FIG. 9A in which the strain control patterns are arranged in the shape of a lattice, the strain control patterns illustrate smaller strain at the center portions than around them. Further, in FIG. 9B in which the strain control patterns are arranged in the shape of another lattice, it can also be seen that the strain control patterns illustrate smaller strain at the center portions than around them.

In FIG. 9C in which the strain control patterns are arranged along a closed curve, it can be seen that the strain control patterns blocks stress generated by an external force and developing into the closed curve, so stress due to strain is small at the center portion of the closed curve.

Referring to FIGS. 9D to 9F, in the distribution of stress when a tensile force is applied to a stretchable substrate according to another embodiment of the present invention, unlike the results described above, it can be seen that the largest stress is exerted in the strain control patterns, that is, stress concentrates on the strain control patterns. Further, it can be seen that the stress due to an external force decreases, as the distance from the strain control patterns increase.

In FIGS. 9D and 9E in which strain control patterns are arranged in the shapes of lattices, it can be seen the strain at the center portions of the lattices is smaller than that at and around the strain control patterns.

In FIG. 9F in which the strain control patterns are arranged along a closed curve, similar to the result of trial testing on the embodiment described above, it can be seen that the strain control patterns blocks stress generated by an external force and developing into the closed curve, so stress due to strain is small at the center portion of the closed curve.

As set forth above, according to the stretchable substrate and the electronic device of exemplary embodiments of the invention, even if the substrate is deformed due to an external force, it is possible to adjust stress that is exerted in objects such as an electronic element, using the strain control patterns. Further, according to the stretchable substrate and the electronic device of the present invention, even if the substrate bends or extends due to an external force, the objects such as an electronic element on the substrate can operate stably.

According to the method of forming a stretchable substrate of the present invention, it is possible the manufacture a stretchable substrate having the technological effects described above.

While the present invention has been illustrated and described in connection with the exemplary embodiments, it will be apparent to those skilled in the art that modifications and variations can be made without departing from the spirit and scope of the invention as defined by the appended claims.

What is claimed is:

1. A stretchable substrate comprising:
a stretchable substrate having first Young's modulus and stretchability; and
strain control patterns having second Young's modulus, printed and arranged on the stretchable substrate,
wherein the second Young's modulus is larger than the first Young's modulus,
wherein a ratio of the first Young's modulus to the second Young's modulus is greater than or equal to 1:325;
wherein strain due to an external force depends on arrangement of the printed strain control patterns,
wherein the stretchable substrate includes:
a stretchable support substrate having the first Young's modulus;
and a stretchable member having the first Young's modulus and disposed on and covering the stretchable support substrate,
wherein the printed strain control patterns are disposed on the stretchable support substrate and are covered with the stretchable member,
wherein the printed strain control patterns are arranged along a closed curve when viewed from a top of the stretchable substrate such that a stress reduction area is formed inside the closed curve by arrangement of the printed strain control patterns, and an electronic circuit is disposed in the stress reduction area on the stretchable substrate.

2. The stretchable substrate of claim 1, wherein the stretchable substrate includes any one selected from a group of PDMS (Polydimethylsiloxane), epoxy resin, ecoflex, and polyurethane.

3. The stretchable substrate of claim 1, wherein the printed strain control pattern includes a cured polymer.

4. The stretchable substrate of claim 1, wherein the electronic circuit is disposed on a top surface of the stretchable member, which has a bottom surface covering the printed strain control patterns.

5. The stretchable substrate of claim 4, wherein the electronic circuit unit is disposed to avoid overlapping with the printed strain control patterns when viewed from a top of the stretchable substrate.

6. The stretchable substrate of claim 1, wherein the printed strain control pattern is formed on the stretchable substrate by inkjet printing, gravure printing, or roll-to-roll printing.

7. An electronic device comprising:
a stretchable substrate; and
an electronic circuit unit on the stretchable substrate,
wherein strain control patterns are printed and disposed inside the stretchable substrate,
wherein the stretchable substrate includes:
a stretchable support substrate having a first Young's modulus;
and a stretchable member having a second Young's modulus and disposed on and covering the stretchable support substrate,
wherein the second Young's modulus is larger than the first Young's modulus,
wherein a ratio of the first Young's modulus to the second Young's modulus is greater than or equal to 1:325;
wherein the printed strain control patterns are disposed on the stretchable support substrate and are covered with the stretchable member,
wherein the printed strain control patterns are arranged along a closed curve when viewed from a top of the stretchable substrate such that a stress reduction area is formed inside the closed curve by arrangement of the printed strain control patterns, and the electronic circuit unit is disposed in the stress reduction area on the stretchable substrate.

8. The electronic device of claim 7, wherein the stretchable substrate includes at least any one selected from a group of PDMS (Polydimethylsiloxane), epoxy resin, and polyurethane.

9. The electronic device of claim 7, wherein the printed strain control pattern includes a cured polymer.

10. The electronic device of claim 7, wherein the electronic circuit unit is disposed on a top surface of the stretchable member, which has a bottom surface covering the printed strain control patterns.

11. The electronic device of claim 10, wherein the electronic circuit unit is disposed to avoid overlapping with the printed strain control patterns when viewed from a top of the stretchable substrate.

12. The electronic device of claim 7, wherein the printed strain control pattern is formed on the stretchable substrate by inkjet printing, gravure printing, or roll-to-roll printing.

* * * * *